United States Patent
McFeely et al.

(10) Patent No.: US 7,749,802 B2
(45) Date of Patent: *Jul. 6, 2010

(54) PROCESS FOR CHEMICAL VAPOR DEPOSITION OF MATERIALS WITH VIA FILLING CAPABILITY AND STRUCTURE FORMED THEREBY

(75) Inventors: Fenton R. McFeely, Ossining, NY (US); Alejandro G. Schrott, New York, NY (US); John J. Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 134 days.

This patent is subject to a terminal disclaimer.

(21) Appl. No.: 11/621,365

(22) Filed: Jan. 9, 2007

(65) Prior Publication Data

US 2008/0164579 A1 Jul. 10, 2008

(51) Int. Cl.
*H01L 21/00* (2006.01)
*H01L 21/82* (2006.01)
*H01L 21/20* (2006.01)

(52) U.S. Cl. .................. 438/95; 438/128; 438/483; 257/E21.17

(58) Field of Classification Search ............ 438/128, 438/95, 483; 257/E21.17, E45.002
See application file for complete search history.

(56) References Cited

U.S. PATENT DOCUMENTS

| 7,473,597 B2 * | 1/2009 | Lee et al. ............... 438/253 |
| 2004/0213907 A1 * | 10/2004 | Todd et al. ............ 427/255.18 |
| 2006/0071213 A1 * | 4/2006 | Ma et al. .................. 257/65 |
| 2006/0172067 A1 * | 8/2006 | Ovshinsky et al. ...... 427/248.1 |
| 2007/0160760 A1 * | 7/2007 | Shin et al. ............. 427/255.35 |
| 2008/0164580 A1 * | 7/2008 | Gardner et al. ........... 257/631 |

FOREIGN PATENT DOCUMENTS

| CN | 1738022 A | 2/2006 |
| WO | WO 2007067604 A2 * | 6/2007 |

* cited by examiner

*Primary Examiner*—Shouxiang Hu
(74) *Attorney, Agent, or Firm*—Scully, Scott, Murphy & Presser, P.C.; Vazken Alexanian

(57) ABSTRACT

A chemical vapor deposition (CVD) method for depositing materials including germanium (Ge) and antimony (Sb) which, in some embodiments, has the ability to fill high aspect ratio openings is provided. The CVD method of the instant invention permits for the control of GeSb stoichiometry over a wide range of values and the inventive method is performed at a substrate temperature of less than 400° C., which makes the inventive method compatible with existing interconnect processes and materials. In addition to the above, the inventive method is a non-selective CVD process, which means that the GeSb materials are deposited equally well on insulating and non-insulating materials.

18 Claims, 2 Drawing Sheets

PROCESS FOR CHEMICAL VAPOR DEPOSITION OF MATERIALS WITH VIA FILLING CAPABILITY AND STRUCTURE FORMED THEREBY

FIELD OF THE INVENTION

The present invention relates to semiconductor devices and semiconductor device fabrication. More particularly, the invention relates to a chemical vapor deposition (CVD) method for the deposition of a material that comprises germanium (Ge) and antimony (Sb) onto a surface of a substrate. In some embodiments, the inventive method can be used in filling high aspect ratio openings that are present within the substrate. The present invention also relates to a semiconductor structure including at least one opening having a high aspect ratio that is filled with a material comprising Ge and Sb utilizing the method of the present application.

BACKGROUND OF THE INVENTION

Materials which may, via suitable temperature excursions, be reversibly switched between two structural phases characterized by different resistivities, have the potential to be employed as phase change memory materials. One such class of materials is a material that includes germanium (Ge) and antimony (Sb). Hereinafter the materials including Ge and Sb are referred to as GeSb materials.

In order to fabricate practical memory devices, it will be necessary to deposit the GeSb materials upon substrates of substantial topography complexity. A possible structure for implementing a phase change memory device is a line-and-via structure similar to those found in interconnect wiring structures. In such structures, the phase change material in the narrow via opening would constitute the active element of the memory device.

While this class of designs is attractive, they require for their fabrication that high aspect ratio (e.g., height to width ratio) vias be filled with the active material. Since desirable aspect ratios for the vias will typically exceed 3:1, this presents a substantial challenge for physically based deposition methods such as sputtering. As such, alternative deposition processes for filling high aspect ratio openings are being sought.

One promising candidate method for deposition of such materials is chemical vapor deposition. In CVD, numerous organometallic precursors (such as carbonyls, alkyls, etc) with reasonable vapor pressure exist for a large number of candidate metals. The problem to be faced with conventional CVD methods is in performing the deposition at a sufficiently low temperature (less than about 400° C.) while being able to fill high aspect ratio openings of a substrate with a GeSb material.

To date, there is no known chemical vapor deposition (CVD) method for depositing GeSb materials onto a substrate at temperatures less than 400° C. More particularly, there is no known CVD method for depositing GeSb materials which has the ability to fill high aspect ratio openings at temperatures of less than 400° C. As such, there is a need for the development of a chemical vapor deposition method in which the deposition method has the ability to form a blanket GeSb material onto a substrate as well as to effectively fill high aspect ratio openings with a GeSb material.

SUMMARY OF THE INVENTION

The present invention provides a chemical vapor deposition (CVD) method for depositing GeSb materials which, in some embodiments, has the ability to fill high aspect ratio openings. The term "high aspect ratio" is used herein to denote an opening that has a height to width ratio that exceeds 3:1. The term "opening" denotes a line opening, a via opening, a combined line/via structure, a trench, etc. which can be fabricated using lithography and etching. In other embodiments, the present invention provides a CVD method for depositing a blanket GeSb material onto a surface of a substrate.

The CVD method of the instant invention permits for the control of GeSb stoichiometry over a wide range of values and the inventive method is performed at a substrate temperature of less than 400° C., which makes the inventive method compatible with existing interconnect processes and materials. In accordance with the present invention, GeSb materials can be formed of the basic formula $Ge_xSb_y$, wherein x is from about 2 to about 98 atomic %, and y is from about 98 to about 2 atomic %.

In addition to the above, the inventive method is a non-selective CVD process, which means that the GeSb materials are deposited equally well on insulating and non-insulating materials. For the production of line-and-via (line/via) structures including GeSb materials this is advantageous, as the via sidewalls would not require any special activation process prior to the deposition of the GeSb materials.

In general terms, the method of the present invention comprises:

positioning a substrate having an exposed surface in a chemical vapor deposition reactor chamber;

evacuating said reactor chamber including said substrate to a base pressure of less than 1E-3 torr, and preferably less than 1E-6 torr;

heating the substrate to a temperature that is less than 400° C.;

providing an antimony-containing precursor and a germanium-containing precursor to said reactor chamber; and depositing a material comprising germanium (Ge) and antimony (Sb) onto said exposed surface of said substrate from said precursors.

In some embodiments of the present invention, the substrate is a structure having at least one opening that has an aspect ratio of greater than 3:1 and the inventive method has the ability to fill the at least one opening with a GeSb material. In other embodiments, the substrate has a substantially planar surface and the inventive method has the ability to deposit a blanket GeSb material thereon.

In a highly preferred embodiment of the present invention, the method of the present invention comprises:

positioning an interconnect structure having at least line/via structure therein in a chemical vapor deposition reactor chamber, said at least one line/via structure having an aspect ratio of greater than 3:1 evacuating said reactor chamber including said interconnect structure to a base pressure of less than 1E-6 torr;

heating the interconnect structure to a temperature that is less than 400° C.;

providing an antimony-containing precursor and a germanium-containing precursor to said reactor chamber; and depositing a material comprising germanium (Ge) and antimony (Sb) into said at least one line/via structure of said interconnect structure from said precursors.

In addition to a CVD method for the deposition of GeSb materials, the present invention also relates to a semiconductor structure including the GeSb materials formed utilizing the inventive method. In general terms, the semiconductor structure of the present invention comprises:

a material including at least one opening located therein, said at least one opening having an aspect ratio of greater than 3:1; and a chemical vapor deposited material comprising Ge and Sb located within said at least one opening.

In accordance with the present invention, the at least one opening may comprise a via, a line or any combination thereof including a line over a via, or a via over a line. Preferably, the at least one opening is a line over a via structure.

DETAILED DESCRIPTION OF THE INVENTION

The present invention, which provides a CVD method for the deposition of GeSb materials and the structure formed by the same, will now be described in greater detail by referring to the following discussion and drawings that accompany the present application. It is noted that the drawings of the present application are provided for illustrative purposes and, as such, the drawings are not necessarily drawn to scale.

Figure 1:
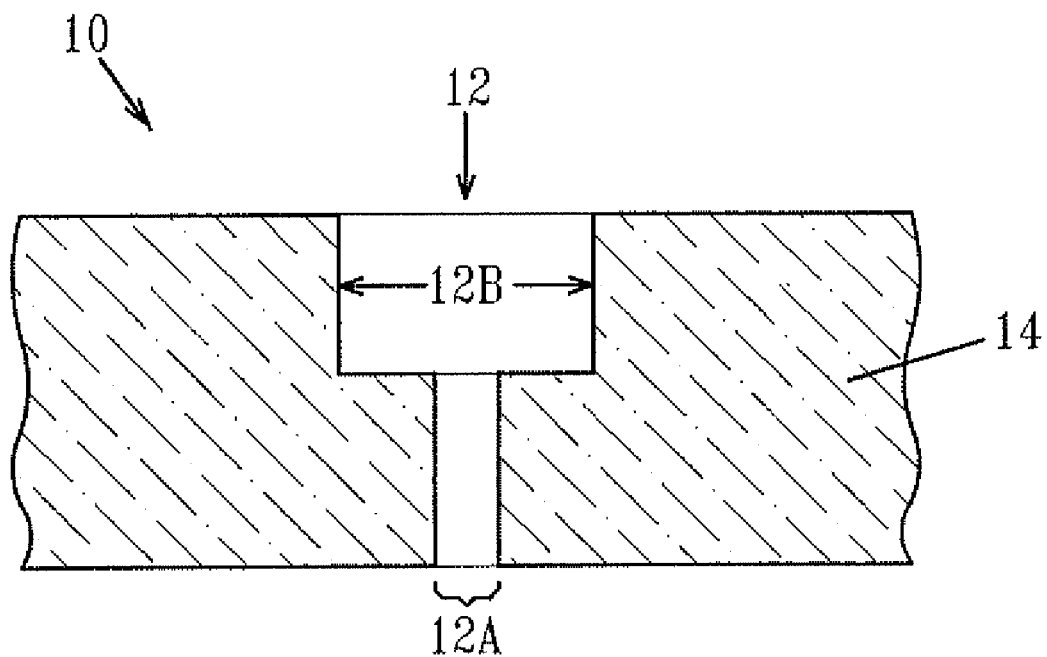
FIG. 1 is a pictorial representation (through a cross sectional view) illustrating an initial structure that can be employed in the present invention prior to chemical vapor deposition of a GeSb material.

Reference is first made to FIG. 1 which illustrates an exemplary structure 10 that can be employed in the present invention. Specifically, the illustrated structure 10 is an interconnect structure that includes at least one opening 12 formed in a dielectric material 14. In accordance with the present invention, the at least one opening 12 has an aspect ratio of greater than 3:1, preferably greater than 10:1. The at least one opening 12 illustrated in FIG. 1 includes a via 12A that is located beneath a line 12B, e.g., a line/via structure. Although FIG. 1 shows a single opening 12 in the structure 11, the present invention is not limited to the same. Instead, a plurality of such openings may be present in the structure 10.

It should be noted that although an interconnect structure including at least one opening 12 is shown and is used as the substrate, the present invention is not limited to the same. Instead, the inventive method can be used to form a blanket layer of GeSb material across a substantially planar surface of a substrate which includes at least one exposed insulating or non-insulating material.

It is further noted that in FIG. 1 a line/via structure is shown by way of example. Hence, the present invention is not limited to such a structure. Instead, other structures having different types of openings, i.e., lines only, vias only, trenches, etc., having an aspect ratio of greater than 3:1, are also contemplated herein.

As indicated above, the initial structure 10 comprises a dielectric material 14 that has at least one opening 12 formed therein. Although such an embodiment is described herein, the present invention is not limited to the same. Instead, the GeSb material which will be described in greater detail below can be formed within at least one opening that is located within a non-insulating material such as a semiconductor material or a conductive material. The definitions of the terms "semiconductor material" and "conductive material" have the same meaning as defined herein below.

In the cases in which the initial structure 10 includes a dielectric material 14, the dielectric material 14 comprises any insulating material that is used as an interlevel dielectric in interconnect technology. Typically, the dielectric material 14 has a dielectric constant (as measured in a vacuum) of about 4.0 or less, with a dielectric constant of about 3.7 or less being even more typical. Examples of such insulating materials that can be used in the present invention as dielectric material 14 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

Although not shown, the dielectric material 14 having the at least one opening 12 is typically located upon a substrate. The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SCOIs).

When the substrate is an insulating material, the insulating material can be an organic insulator, an inorganic insulator or a combination thereof including multilayers. When the substrate is a conductive material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a first interconnect level of a multilayered interconnect structure.

The at least one opening 12 illustrated in FIG. 1 is formed utilizing lithography and etching. The lithographic process includes forming a photoresist atop a hard mask material (e.g., an oxide and/or a nitride) that is typically located atop the dielectric material 14, exposing the photoresist to a desired pattern of radiation and developing the exposed resist. The etching process comprises wet chemical etching and/or dry chemical etching. Of these types of etching processes, a dry chemical etching process such as reactive ion etching, ion beam etching or plasma etching is preferred. In the case of a line/via structure as shown in FIG. 1, a conventional via-first then line process may be employed. Alternatively a line-first then via process is also contemplated in the present invention.

Figure 2:
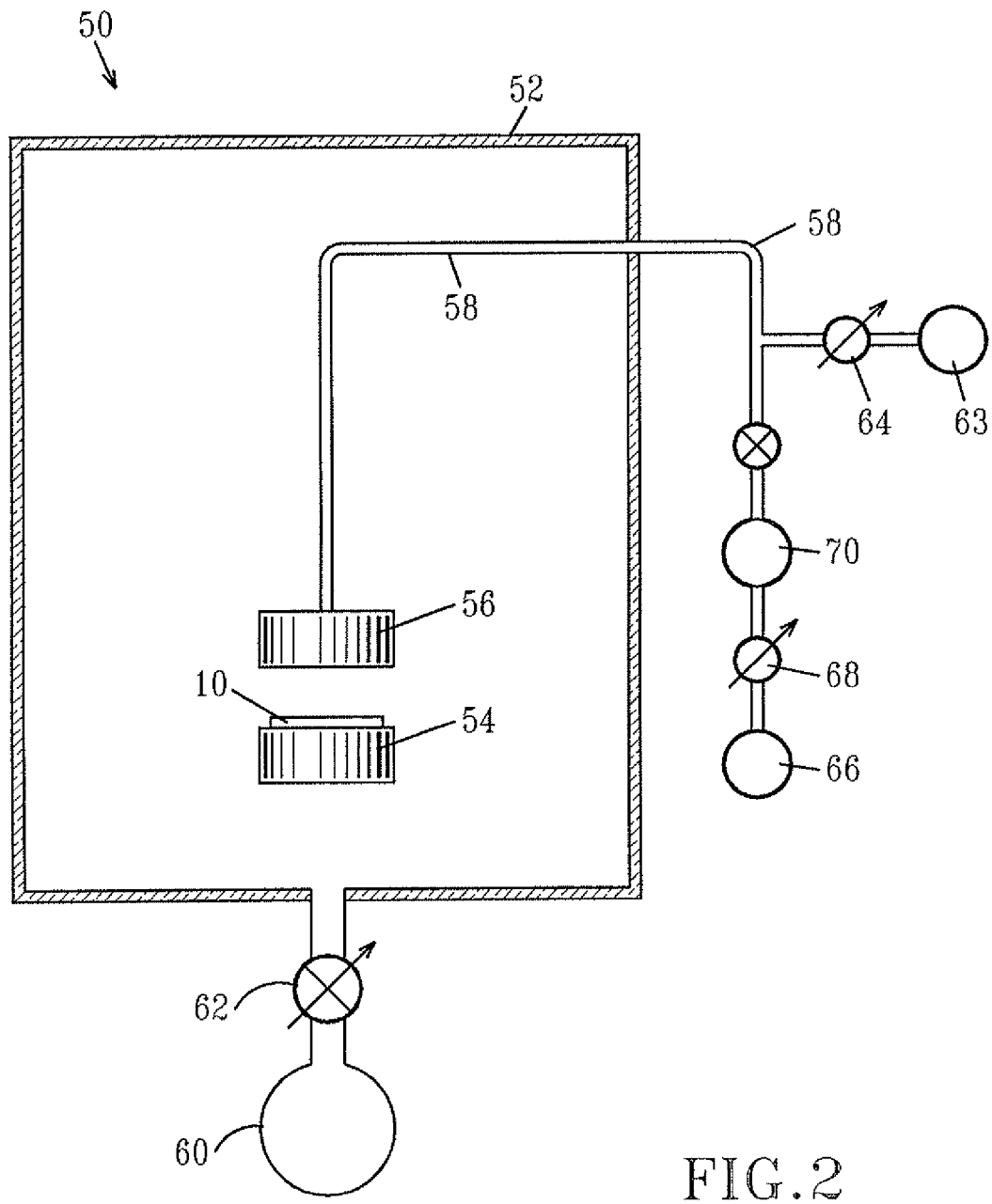
FIG. 2 is a schematic of a chemical vapor deposition apparatus that can be used in one embodiment of the present invention for the deposition of GeSb materials.

Reference is now made to FIG. 2 which illustrates a typical chemical vapor deposition (CVD) reactor 50 that may be employed in the present invention to deposit the GeSb material within the at least one opening 12 shown in FIG. 1. It is noted that although reference is made to the chemical vapor deposition reactor 50 illustrated in FIG. 2, the present invention is not limited to utilizing only such a reactor. Instead, the present invention may be performed utilizing other types of chemical vapor deposition reactors that are well known to those skilled in the art. Other types of reactors that can be employed in the present invention are elaborated further herein below.

Referring back to CVD reactor 50, the CVD reactor 50 includes a reactor chamber 52 in which the initial structure 10 is positioned within. The reactor chamber 52 is typically a vacuum enclosure including, a substrate holder 54, a showerhead 56 that is connect to an intake manifold 58, and a vacuum pump 60, such as a turbo molecular pump, that can be open or shut by a valve 62.

In accordance with the present invention, the initial structure 10 such as shown in FIG. 1 is positioned on a surface of the substrate holder 54 that is located within the CVD reactor chamber 52. A distance from about 10 to about 80 mm typically separates the initial structure 10 from the showerhead 56. Although such a distance is specifically mentioned, the present invention is not limited to the recited distance.

With the initial structure 10 positioned within the reactor chamber 52, the pressure within the reactor chamber 52 is evacuated to a base pressure of less than 1E-3 torr, with a base pressure of less than 1E-6 torr being more preferred. The evacuation to this base pressure is achieved by opening the value 62 to vacuum pump 60.

In some embodiments of the present invention, the substrate holder 54 typically includes a heating element which is capable of heating the initial structure 10 during the subsequent deposition of the Ge-containing and Sb-containing precursors. In accordance with the present invention, the heating element is capable of heating the initial structure 10 to a temperature that is less than 400° C., with a temperature from about 200° to about 350° C. being even more typical.

Ge-containing and Sb-containing precursors are then directed to the heated structure 10 by means of showerhead 56. In accordance with the particular embodiment shown, the precursors are introduced as a gas mixture to the showerhead 56 through intake manifold 58. The precursor gas mixture is formed by admitting a flow of a Ge-containing precursor typically in an inert gas from source 63 by means of a mass controller 64 and by flowing an inert gas from source 66 through mass flow controller 68 through bubbler 70 that includes a Sb-containing precursor. The term "inert gas" is used in the present application to denote a gas which does not participate in the formation of the GeSb material. Examples of such inert gases include Ar, Ne, $N_2$, $H_2$, and He, with Ar being highly preferred.

In accordance with the present invention, the Ge-containing precursor comprises any compound or complex which includes Ge. Examples of Ge-containing precursors include germanes such as monogermane, digermane, trigermane and higher germanes, germane alkyls containing from 1 to about 16 carbon atoms, germane hydrides, and other organo-germanes. Preferably, the Ge-containing precursor is digermane.

The Sb-containing precursor that can be employed in the present invention comprises any compound or complex that includes Sb. Illustrative examples of such precursors include antimony alkyls containing from 1 to about 16 carbon atoms, antimony amines, antimony hydrides and other organo-antimony containing compounds. In one preferred embodiment of the present invention, the Sb-containing precursor is tris (dimethylamino) antimony.

The flow of the two precursors gases employed in the present invention may vary depending on the desired stoichiometry of the resultant GeSb material. In accordance with the present invention, the flow of the Ge-containing precursor in an inert gas is from about 100 to about 1500 sccm, while a flow of about 10 to about 300 sccm of inert gas containing the Sb-containing precursor is employed. In a preferred embodiment of the present invention, the flow of the Ge-containing precursor in an inert gas is from about 800 to about 1500 sccm, while a flow of about 15 to about 50 sccm of inert gas containing the Sb-containing precursor is employed. In a highly preferred embodiment, about 1400 sccm of 20% digermane in Ar is employed, while 20 sccm of Ar containing 20 ml of tris(dimethylamino) antimony is employed. It is understood that flows described above apply to the particular reactor employed. Were another reactor to be employed, e.g., with different volume and pumping speed, the preferred flows could deviate substantially from those given above.

It is noted that during the course of the deposition process the pressure within the reactor chamber 52 is maintained at a deposition pressure from about 1 to about 10 torr. Typically, the deposition pressure within the reactor is maintained at a value from about 6 to about 8 torr during the deposition process.

It is further noted that instead of mixing the two precursors gasses in a single input manifold as described above and as is illustrated in FIG. 2, the inventive method works equally well for cases where separate manifolds are used for each precursor gas and mixing thereof can take place in the showerhead itself, or in the space between the showerhead and the initial substrate 10. The later is referred to as a post-mixing scheme.

The precursors are typically provided to the initial structure 10 as a gas mixture, i.e., simultaneously. Although simultaneous contact is typically preferred, the present invention also can be employed when a layer of Ge is first provided utilizing the Ge-containing precursor and then the Sb-containing precursor is provided.

In accordance with the present invention, a deposition rate of about 10 to about 1000 nm/min of a material comprising Ge and Sb can be achieved, with a deposition rate of from about 20 to about 40 nm/min being even more preferred.

Figure 3:
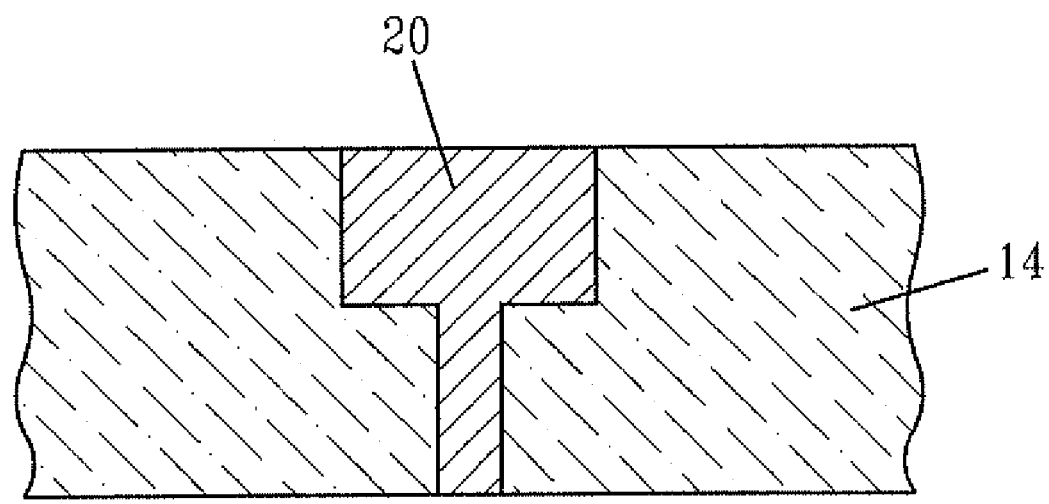
FIG. 3 is a pictorial representation (through a cross sectional view) after filling the at least one opening in the structure shown in FIG. 1 with a GeSb utilizing the method of the present invention.

Under the details described above, the present invention forms a material comprising Ge and Sb that fills the at least one opening 12 resulting in the structure shown in FIG. 3. In FIG. 3, reference numeral 20 denote the material comprising Ge and Sb. In accordance with the present invention, the GeSb material 20 has the formula $Ge_xSb_y$, wherein x is from about 2 to about 98 atomic % Ge, and y is from about 98 to about 2% Sb. More preferably, the GeSb material 20 provided in the present invention is one wherein x, the atomic percent Ge, is from about 10 to about 20 atomic %, and y, the atomic percent Sb, is from about 90 to about 80 atomic %.

Neither the deposition rate, nor the stoichiometry and morphology of the GeSb material deposited appear to be significantly affected by the choice of material 14. As stated above, GeSb materials can be deposited on insulators such as $SiO_2$ with equal facility as on bare silicon or titanium nitride. The deposition is therefore a non-selective blanket process. Nevertheless, the process is not merely the mutual pyrolysis of the Ge-containing and Sb-containing precursors. If the Sb-containing precursor was omitted from the process gas mixture, and $SiO_2$ is employed as the dielectric material 14, a pure germanium film is deposited. However, if one attempts to grow a pure antimony film on $SiO_2$ by omitting the Ge-containing precursor from the process gas mixture, the result is not a pure antimony film, but rather no film growth at all. Since very little germanium is required to grow an antimony rich film, but no germanium at all causes the process to fail on $SiO_2$, it is surmised that the germanium serves to activate the $SiO_2$ surface for the subsequent decomposition of the antimony precursor, and that this phenomenon accounts for the insensitivity to the choice of substrate material.

The dependence of the deposition process upon the Ge-containing precursor highlights the desirability of digermane as a preferred precursor. To achieve via filling, a CVD process must possess extremely high conformality. For high conformality, the deposition reaction must take place in a temperature regime (see the above mentioned range) in which the overall reaction rate is limited by the rate of the reaction of the precursors at the growth surface; as opposed to being limited by the rate of transport of precursor molecules to the growth surface. In this regime, there is no substantial depletion of precursor molecules in proceeding down a high aspect ratio via, and "pinch off" is avoided. To operate in this regime, the lowest practical temperature should be selected, so as to provide sufficiently low and rate limiting surface reaction rates for each precursor species in use in the process. Digermane is useful in this respect as is more reactive than the more commonly used germane. To attempt this process substituting germane for digermane, it would be necessary to increase the temperature of the substrate. This would tend to move the process out of the surface reaction limited regime and would tend to make via filling more difficult. Although with suitable reaction conditions it should still be possible. Thus, in the preferred embodiment of the process the germanium precursor comprises digermane.

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of chemical vapor deposition of a material comprising Ge and Sb comprising:
   positioning a substrate having an exposed surface in a chemical vapor deposition reactor chamber;
   evacuating said reactor chamber including said substrate to a base pressure of less than 1E-3 torr;
   heating the substrate to a temperature that is less than 400° C.;
   providing an antimony-containing precursor and a germanium-containing precursor to said reactor chamber; and
   depositing a material comprising germanium (Ge) and antimony (Sb) on said exposed surface of said substrate from said precursors wherein said substrate is an interconnect structure having at least one opening therein that has an aspect ratio of greater than 10:1 and said material comprising Ge and Sb is deposited conformally within said at least one opening.

2. The method of claim 1 wherein said precursors are provided simultaneously to said reactor chamber.

3. The method of claim 1 wherein said germanium-containing precursor is provided first to said reactor chamber to form a layer of Ge, followed by said antimony-containing precursor.

4. The method of claim 1 wherein said germanium-containing precursor is a germane, a germane alkyl containing from 1 to about 16 carbon atoms, a germane hydride, or other organo-germanes.

5. The method of claim 1 wherein said germanium-containing precursor is digermane.

6. The method of claim 1 wherein said antimony-containing precursor is an antimony alkyl containing from 1 to about 16 carbon atoms, an antimony amine, an antimony hydride or other organo-antimony containing compounds.

7. The method of claim 1 wherein said antimony-containing precursor is tris(dimethylamino) antimony.

8. The method of claim 1 wherein said heating is performed at a temperature from about 250° to about 350° C.

9. The method of claim 1 wherein a pressure from about 1 to about 10 torr is maintained during said depositing.

10. The method of claim 1 wherein said material comprising Ge and Sb has the formula $Ge_xSb_y$ wherein x is from about 2 to about 98 atomic % Ge, and y is from about 98 to about 2 atomic percent Sb.

11. The method of claim 1 wherein said providing the antimony-containing precursor and the germanium-containing precursor to said reactor chamber further includes the presence of Ar, Ne or He.

12. The method of claim 1 wherein said substrate is selected from a dielectric material and a conductive material.

13. The method of claim 1 wherein said depositing is performed at a deposition rate from 10 to 1000 nm/min.

14. A method of chemical vapor deposition of a material comprising Ge and Sb with via filling capability comprising:
   positioning an interconnect structure having at least one opening therein in a chemical vapor deposition reactor chamber, said at least one opening having an aspect ratio of greater than 10:1;
   evacuating said reactor chamber including said interconnect structure to a base pressure of less than 1E-3 torr;
   heating the interconnect structure to a temperature that is less than 400° C.;
   providing an antimony-containing precursor and a germanium-containing precursor to said reactor chamber; and
   depositing a material comprising germanium (Ge) and antimony (Sb) conformally into said at least one opening of said interconnect structure from said precursors.

15. The method of claim 14 wherein said precursors are provided simultaneously to said reactor chamber.

16. The method of claim 14 wherein said germanium-containing precursor is provided first to said reactor chamber to form a layer of Ge, followed by said antimony-containing precursor.

17. The method of claim 14 wherein said material comprising Ge and Sb has the formula $Ge_xSb_y$ wherein x is from about 2 to about 98 atomic % Ge, and y is from about 98 to about 2 atomic percent Sb.

18. The method of claim 14 wherein said germanium-containing precursor is digermane and said antimony-containing precursor is tris(dimethylamino) antimony.

* * * * *